United States Patent [19]

Gordon

[11] Patent Number: 5,066,616

[45] Date of Patent: Nov. 19, 1991

[54] METHOD FOR IMPROVING PHOTORESIST ON WAFERS BY APPLYING FLUID LAYER OF LIQUID SOLVENT

[75] Inventor: William G. Gordon, Corvallis, Oreg.

[73] Assignee: Hewlett-Packard Company, Palo Alto, Calif.

[21] Appl. No.: 581,248

[22] Filed: Sep. 7, 1990

Related U.S. Application Data

[63] Continuation of Ser. No. 365,870, Jun. 14, 1989, abandoned.

[51] Int. Cl.$^5$ .................. H01L 21/00; H01L 21/02; H01L 21/30; B05D 1/40
[52] U.S. Cl. .................................... 437/229; 437/225; 437/228; 437/231; 148/DIG. 137; 426/96; 426/240
[58] Field of Search ............... 437/225, 228, 229, 231; 148/DIG. 137; 118/52, 55, 320; 427/96, 99, 240; 430/5, 272, 298, 312, 327, 394

[56] References Cited

U.S. PATENT DOCUMENTS

| | | | |
|---|---|---|---|
| 4,113,492 | 9/1978 | Sato et al. | 427/240 |
| 4,143,189 | 3/1979 | Woods et al. | 427/393.5 |
| 4,188,707 | 2/1980 | Asano et al. | 437/155 |
| 4,278,754 | 7/1981 | Yamashita et al. | 427/43.1 |
| 4,290,384 | 9/1981 | Ausschnitt et al. | 118/722 |
| 4,393,807 | 7/1983 | Fujimura et al. | 118/52 |
| 4,658,495 | 4/1987 | Flatley et al. | 437/191 |
| 4,661,431 | 4/1987 | Bujese et al. | 430/216 |
| 4,696,885 | 9/1987 | Vijan | 427/96 |
| 4,741,926 | 5/1988 | White et al. | 437/231 |
| 4,800,836 | 1/1989 | Yamamoto et al. | 118/52 |

FOREIGN PATENT DOCUMENTS

| | | |
|---|---|---|
| 2743011 | 3/1979 | Fed. Rep. of Germany . |
| 0085524 | 5/1985 | Japan . |
| 0081625 | 4/1986 | Japan . |
| 0091655 | 5/1986 | Japan . |
| 0150332 | 7/1986 | Japan . |
| 0058375 | 3/1989 | Japan . |

OTHER PUBLICATIONS

Moreau, W., Coating Solvent for Resist Films, IBM Tech. Dis. Bull. (USA), vol. 23, No. 3, p. 991, Aug. 1980.
Holihan, J., Controlled Gap Photoresist Spinning Process, IBM Tech. Dis. Bull. (USA), vol. 17, No. 11, p. 3281, Apr. 1975.
Wolf, S., Silicon Processing for the VLSI Era, vol. 1, pp. 430-434, Lattice Press, 1986.

*Primary Examiner*—Brian E. Hearn
*Assistant Examiner*—B. Everhart

[57] ABSTRACT

A method for applying photoresist to a top surface of a semiconductor wafer for defining an electronic circuit pattern. The wafer is placed on a horizontal turntable and liquid solvent is dispensed onto the wafer's top surface. Spinning the wafer distributes the solvent to a substantially uniform film thickness over the entire top surface. Liquid photoresist is dispensed onto the top surface over the solvent film, preferably while spinning the wafer, to distribute a photoresist layer over the entire top surface. Photoresist discharge is controlled so that the wafer sirface remains entirely wetted by the solvent film during distribution of the liquid photoresist. The solvent viscosity is lower than the liquid photoresist viscosity and the solvent film thickness is sufficient to enable the photoresist to fully cover any bare silicon, high density or undercut circuit features, generally in a range of 500 to 10,000 Angstroms and preferably 1,000 to 5,000 Angstroms.

20 Claims, 1 Drawing Sheet

METHOD FOR IMPROVING PHOTORESIST ON WAFERS BY APPLYING FLUID LAYER OF LIQUID SOLVENT

CROSS REFERENCE TO RELATED APPLICATION

This application is a continuation of application Ser. No. 07/365,870, filed June 14, 1989, now abandoned.

BACKGROUND OF THE INVENTION

This invention relates generally to processes for fabricating integrated circuits, and more particularly to a technique that can be used in such processes to facilitate application of photoresist to a wafer without mottling preparatory to a masking and patterning procedure.

Conventional integrated circuit fabrication processes use one or more photolithographic steps to define patterns on the surface of a silicon wafer or similar substrate. These patterns are used in subsequent steps to form a wide variety of features which, together, form the active devices and interconnecting circuitry of an integrated circuit. As shown in FIG. 1, the substrate is ordinarily a semicircular wafer. A checkerboard pattern of square or rectangular dice is formed by scribe lines, along which the dice can be separated once the processing steps that are performed on the wafer have been completed.

Conventional photolithography comprises a number of well-known steps. First, the substrate is placed on a turntable. Then, the top substrate surface, upon which the circuit features are to be forced, is cleaned by a volatile liquid solvent. The solvent may include an appropriate bonding agent to assist in adhering a layer of photoresist, to be applied subsequently, to the substrate surface. Next, the turntable is operated to spin the wafer as indicated by the arrow in FIG. 1. This operation spins off the excess solvent and, conventionally, is continued until the substrate surface appears dry. Then the turntable is turned off. After the wafer ceases spinning, a predetermined quantity of liquid photoresist solution is dispensed onto the top substrate surface. The turntable is again operated to spin the wafer and thereby spread the liquid photoresist over the substrate surface. Once the photoresist layer is dried, it is selectively exposed, using either a mask or direct writing technique, to pattern each die in accordance with the desired configuration of one layer of the overall integrated circuit design layout. Subsequent steps, such as etching, doping, oxidation and various deposition steps, are performed using this and subsequently formed and patterned photoresist layers.

Many different factors can adversely affect the quality, uniformity and reliability of photolithographic techniques as used in state-of-the-art integrated circuit fabrication processes. These factors include the materials, techniques and conditions of application of the photoresist layer. Ideally, the resultant photoresist layer will be of such a quality that will enable accurate photoreproduction of all of the microscopic details of the mask, first, in the photoresist layer and, second, in the physical circuit features that are to be formed using this layer.

All of the physical, chemical and environmental factors need to be controlled carefully. Otherwise, a patterning step can fail, as to a wafer or an entire batch of wafers, or as to some proportion of the individual dice, dependent on the statistical effects of the fault-causing factor. Sometimes, individual factors alone may not be sufficient to cause problems but, in combination, will adversely affect the qualities of the photoresist layer and, ultimately, the quality of the resultant circuit structures.

The particular problem addressed by the present invention is to avoid mottling. Mottling is a defect in the distribution of a photoresist layer on a wafer in which portions of a substrate surface are not coated at all, or are inadequately coated by photoresist. The factors that lead to mottling are not well understood. Mottling seems to occur most commonly in photoresist layers that are applied over steep or undercut topographies, such as over-etched circuit layers, and on wafers in which the dies are rectangular rather than square. The affinity of a photoresist material for the exposed surface materials of the substrate is a factor. Silicon is phobic to many photoresist compositions, which is why bonding agents are used, although not with sure success. Another factor is the structure of the circuit itself. High density circuits, those having a high density of structural features formed on the top surface of the substrate, are more prone to problems than low density circuits.

Some levels of a given fabrication process are likely to be more sensitive than others. For example, applicant has worked extensively with Hewlett Packard's CMOSC process. Mottling problems have often occurred at the lateral channel stop (LCS) level. At this intermediate level, the surface structure includes substantial bare silicon and an etched nitride layer which presents an undercut lip to the photoresist. The occurrence of mottling was widely variable, and highly sensitive to minor changes of conditions or combinations of conditions. When all conditions were apparently optimal, mottling would affect as few a 1% of dice. When some conditions deteriorated, mottling would increase and commonly affect 30% of the dice, and on occasion entire lots of wafer have had to be reworked.

Prior attempts to discern and control the source of mottling have met with little success. One approach has been to simply flood the wafer surface with photoresist, using two or more times the usual amount of liquid photoresist. This met with little success and is wasteful of photoresist. It is also susceptible to problems, such as filter clogging, that affect the accurate metering of higher volumes of photoresist. It is also possible to allow the photoresist to stand on the substrate surface for an extended period of time before spinning off the excess, to give the photoresist time to fully wet the substrate surface. This approach can result in radially uneven distribution of the photoresist layer. Radially uneven photoresist distribution can interfere with close contact between the mask and the photoresist surface over the entire wafer, and uneven exposure of the photoresist layer, resulting in blurring of exposed boundaries in many dice.

Accordingly, a need remains for a technique for more reliably applying photoresist to wafers without mottling.

SUMMARY OF THE INVENTION

One object of the invention is to improve the application of photoresist to a top surface of a substrate in the fabrication of integrated circuits.

A second object is to improve the yield and consistency of yield of operative dice, particularly of those containing high density circuitry, circuit structures with substantial variations in topography, or resist phobic exposed surface materials.

A particular object of the invention is to reduce, and preferably eliminate, mottling in the application of photoresist layers to substrates as aforesaid.

An additional object is to reduce the sensitivity of successful photoresist application to minor changes in conditions.

The invention is an improvement in existing techniques for applying photoresist to integrated circuit wafer surfaces, which substantially reduces, and usually eliminates, mottling in fabrication process steps and integrated circuit designs where mottling would otherwise occur. Briefly, the improved technique calls for dispensing the liquid photoresist onto the top surface of the substrate while it is still wet with cleaning solvent. Preferably, this is done while the substrate is still spinning in connection with distribution of the cleaning solvent.

More particularly, in a preferred embodiment, the method comprises positioning the wafer on a horizontal turntable with the top surface facing upward; discharging a liquid solvent onto a central area of the top surface; spinning the wafer to distribute a film of the solvent to a substantially uniform thickness over the entire top surface of the wafer; discharging a liquid photoresist onto the central area of the top surface of the wafer over the solvent film; and spinning the wafer to distribute the photoresist over the entire top surface of the wafer. The discharge of photoresist is controlled so that the top surface of the wafer remains entirely wetted by the solvent film during discharge and distribution of the liquid photoresist. The wafer may have an intermediate electronic circuit pattern formed thereon, which includes bare silicon surfaces, high density circuit features or undercut circuit features. The solvent used should have a viscosity less than the viscosity of the liquid photoresist and the solvent film should have sufficient fluid thickness to cause the photoresist to fully cover said bare silicon, high density or undercut circuit features. The solvent film should have a thickness of at least 100 Angstroms when application of the photoresist is commenced, and preferably has a thickness in a range of 500 to 10,000 Angstroms when application of the photoresist is commenced.

The foregoing and other objects, features and advantages of the invention will become more readily apparent from the following detailed description which proceeds with reference to the accompanying drawings.

DETAILED DESCRIPTION

Figure 1:
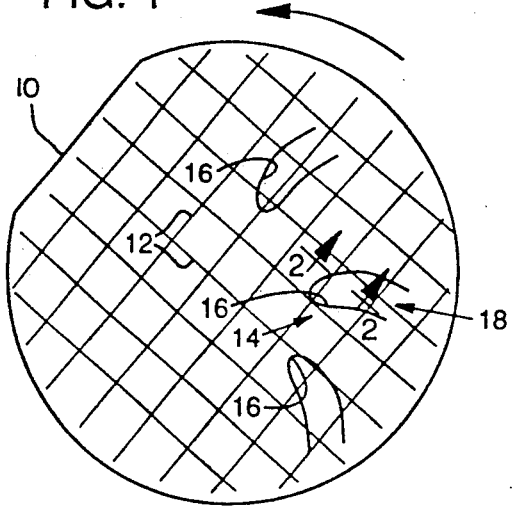
FIG. 1 is a top plan view of a silicon wafer, schematically showing dice inscribed in the substrate surface and mottling in a layer of photoresist applied over the substrate surface.

Referring to FIG. 1, a typical form of substrate is a silicon wafer 10, although the invention is applicable to other substrate materials. The substrate has scribe lines 12 which define square or rectangular dice, such as die 14 and die 18. When photoresist is applied in accordance with conventional procedures, mottling of the photoresist layer may result, as discussed above, leaving regions that are not adequately covered by photoresist. These regions are indicated in FIG. 1 by photoresist boundaries 16. Absent mottling, die 14 will be adequately covered with photoresist and can be appropriately patterned to make an operative integrated circuit. Die 18, on the other hand, has a portion that is not covered by photoresist and, therefore, cannot be patterned to form circuit features that are critical to making the device operative. The mottling features tend to display characteristics that are influenced by the spinning of the wafer to spread photoresist, such as a radial orientation, and characteristics of the dice as laid out on the wafer, such as boundaries along scribed lines, areas of bare silicon or high density circuit features, which are typically rectilinear in shape.

Figure 2:
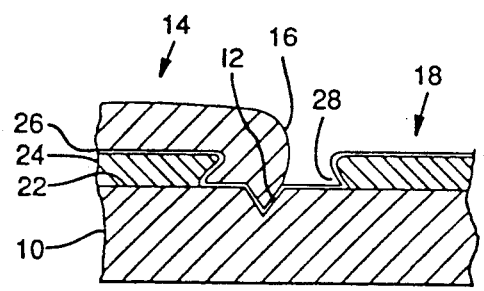
FIG. 2 is an enlarged cross-sectional view taken along lines 2—2 in FIG. 1, showing an exposed silicon surface, an undercut nitride layer, and a boundary between the layer of photoresist and a mottled region.

FIG. 2 shows the wafer 10 with a substrate surface 22 and scribe line 12 inscribed in the bare silicon surface 22 between dice 14, 18. For purposes of illustration, a good die 14 is shown alongside a defective die 18. Both dice have an earlier formed circuit feature 24, which could be, for example, a layer of nitride that has been patterned in a prior processing step, such as the lateral channel stop (LCS) level mentioned above. Layer 24 is shown with an undercut perimeter 28. Following conventional photoresist application procedures, a quantity of liquid solvent containing a bonding agent has been applied and spun off until apparently dry. In the example mentioned above, the liquid composition was ethylene glycol monoethyl ether acetate, also known as cellusolve acetate or EGMEA ($CH_3COOCH_2C-H_2OC_2H_5$) as the solvent, and 30% hexamethyldisilazane, or HMDS ($C_6H_{19}Si_2N$), as the bonding agent (and which is also a solvent for photoresist). Spinoff leaves a thin residual film 26 of bonding agent and solvent on the exposed surfaces of the substrate and structures 24. The surface visually appears dry, meaning that the film 26 has thickness less than 500 Angstroms. The solvent and bonding agent are volatile, but bond to some extent with the substrate surface, so the resultant layer 26 may actually be as thin as a monolayer or a few molecular layers, probably under 50 Angstroms and very likely under 100 Angstroms thick.

The conventionally-applied photoresist layer is shown terminating in a boundary 16 which, for illustrative purposes, is located at scribe line 12 on the bare silicon surface. This boundary can occur at locations other than scribe lines, for example, along device features, such as undercut 28 in layer 24. The photoresist boundary is shown with a bulbous shape in FIG. 2 because liquid photoresist has a high viscosity and surface tension. Although mottling may take a number of different forms that vary from what is shown in FIG. 2, this form and other forms are effectively curtailed by the invention, as next described.

Figure 3:
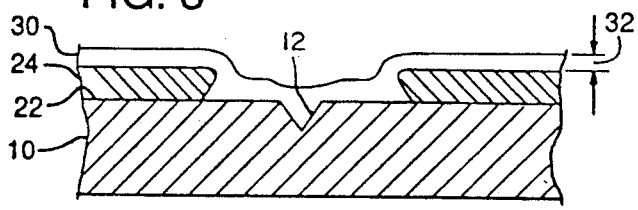
FIGS. 3 and 4 are cross-sectional views similar to FIG. 2, showing application of a film of liquid solvent to wet the substrate surface followed by application of a layer of liquid photoresist over the liquid solvent film in accordance with the invention.

FIG. 3 shows a wafer having the same initial conformation as that of FIG. 2, namely a substrate 10 with scribe lines 12 in surface 22 and deposited and etched layer structures 24 in each die. The first step of the technique of the invention is to apply a film 30 of liquid solvent (such as EGMEA with HMDS) over the entire substrate surface and to distribute the solvent approximately uniformly through a predetermined range of thickness indicated by reference numeral 32. This range of thickness can vary but must be sufficient to wet the substrate surface with liquid solvent.

Figure 5:
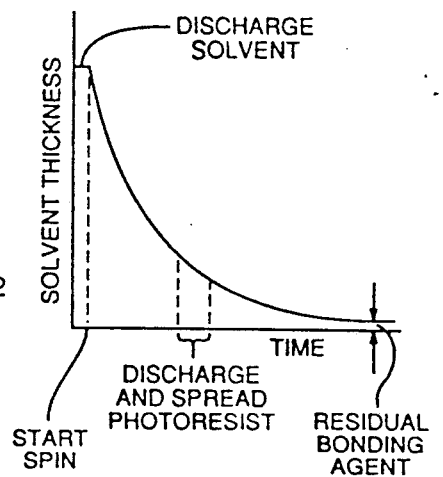
FIG. 5 is a time-based graph of the technique of the present invention for discharging and spreading liquid photoresist on the substrate surface while the surface is still wet with solvent.

FIG. 5 is a graph illustrating the technique of the invention along a time line. The sequence commences with the discharge of solvent onto the surface of the substrate. The solvent accumulates on the substrate to an initial thickness shown along the vertical axis. Next, the turntable is operated to spin off excess solvent. This procedure reduces the thickness of the solvent, as indicated by the descending portion of the curve in FIG. 5. If the wafer were spun until the solvent appeared completely dried, as in the prior art, the solvent thickness would ultimately reduce to the thickness of the residual bonding layer, as indicated at the far right in FIG. 5, and as shown as layer 26 in FIG. 2. This is not allowed to happen in the present invention.

Figure 4:
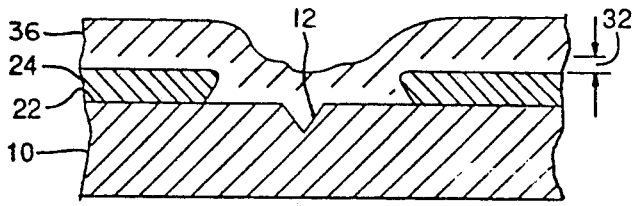

Referring to FIG. 4, a predetermined quantity of liquid photoresist solution 36 is dispensed onto the wafer, while it is still spinning from the step of FIG. 3, over the liquid solvent film 30. The liquid photoresist solution is immediately spread, as it is being discharged, over the entire surface of the wafer. As shown in FIG. 5, this is done at a time when the liquid solvent still has a measurable fluid thickness, well before it has dried down to just a residual bonding layer of 100 Angstroms or less.

Discharging and spreading the liquid photoresist while the substrate surface remains wet with a fluid film of solvent facilitates distribution of the photoresist over the entire surface of the wafer, over bare silicon surface areas, scribe lines and etched layers deposited on the substrate surface, including those with undercut boundaries. Incidence of mottling, even at heretofore highly sensitive levels of fabrication, is reduced to nil. Sensitivity of successful photoresist application to minor variations in multiple conditions is greatly reduced.

While the precise mechanisms are not fully understood, it is believed that the liquid solvent film 30 facilitates spreading the photoresist solution 36 in several ways. First, the fluid solvent, apparently more philic to silicon than liquid photoresist, effectively pre-wets the substrate and device feature surfaces. This enables the photoresist more readily to come into intimate contact with such surfaces. Second, the photoresist solution already contains some proportion of the solvent, and is readily miscible with it. The solvent film 30 may locally dilute the photoresist solution at the interface between the photoresist solution and the liquid film, thereby reducing the viscosity of the photoresist at such interface. This dilution, and possibly an active solution-type interaction, may also facilitate the migration of photoresist into undercut areas. The liquid solvent film may also reduce the overall surface tension of the liquid photoresist layer.

Regardless of the precise mechanism or combination of mechanisms, the technique of the present invention reliably and uniformly coats substrates with photoresist, even in high density and high topography circuit designs that are particularly prone to mottling. It does this without flooding the wafer surface with liquid photoresist. Conventional quantities of photoresist can be used with virtually 100% reliability.

As mentioned above, a predetermined measurable amount of liquid solvent must be left on the substrate surface when the liquid photoresist is discharged. Simply put, the substrate surface must be wet with fluid solvent, not apparently dry, though an excess of solvent is not desirable. A suitable amount, or thickness, of solvent film may be determined a number of different ways. One is empirically, by testing different time intervals. If too much solution remains, the photoresist may not consistently coat the substrate surface, affecting repeatability. If too little remains, mottling will begin to occur. Another is visually: When first dispensed onto a stationary wafer, the solvent appears colorless and transparent. During spinoff, as the thickness of the liquid film approaches the wavelength of light (beginning at about 15,000 Angstroms thickness), under visible light (center wavelength about 5,500 Angstroms, bandwidth about 2,000 Angstroms) interference colors will appear (alternating between red and green shades). While these colors are still apparent, the photoresist is dispensed. If the photoresist were not dispensed during this time interval and spinoff were continued in conventional manner, the interference colors would disappear (at about 500 Angstroms film thickness) and the wafer surface would soon turn silver or grey, proceeding from the perimeter toward the center of the wafer. Experimentally, mottling was found to begin to appear at this stage.

EXAMPLE

Following is an implementation of the invention for applying photoresist in the lateral channel stop level of the Hewlett Packard CMOSC process. With little or no change, it can be applied to any level in any fabrication process on silicon, although it may only be needed at one level. Its principles can be readily extended to other materials, such as GaAs. This implementation is preferably computer-controlled for consistency, but has been successfully executed manually.

1. Position wafer on-axis in chuck (turntable). Conventional solvent and photoresist dispensers are positioned centrally over the chuck.

2. Turn on liquid solvent dispenser to discharge solvent (EGMEA with 30% HMDS; viscosity: 0.5–5.0 centistokes).

3. Wait 2 seconds, then turn off solvent, discharging about 3.5 milliliters of solvent onto wafer top surface.

4. Wait 5 seconds.

5. Spin wafer at 4000 r.p.m. for 2.6 seconds, which spins off the majority of the solvent.

6. Slow the chuck to 500 r.p.m. and wait 1 second. At this stage, the solvent film thickness shows interference colors consistent with a thickness in the range of 1,000 to 5,000 Angstroms.

7. Turn on photoresist dispenser to discharge liquid photoresist (Shipley MICROPOSIT 1400-27, containing 62% EGMEA, 6% n-butyl acetate, 6% Xylene; viscosity: 17.5–17.9 centistokes) onto wafer atop the liquid solvent film.

8. Wait 5 seconds while continuing to spin wafer at 500 r.p.m. to spread photoresist over wafer surface.

9. Turn off photoresist dispenser. This discharges about 3.5 milliliters of photoresist.

10. Spin wafer at 3400 r.p.m. for 12 seconds.

11. Turn off chuck. This leaves a photoresist layer of about 14,000 Angstroms thickness.

12. The wafer is released from the chuck and transferred to an oven for baking the photoresist layer in conventional manner.

Having illustrated and described the principles of the invention in a preferred embodiment, it should be apparent to those skilled in the art that the invention may be modified in arrangement and detail without departing from such principles. I/we claim all modifications and variations coming within the scope and spirit of the following claims.

We claim:

1. In an integrated circuit fabrication process, a method for uniformly applying photoresist to a top surface of a wafer, the method comprising:
spreading a liquid solvent substantially uniformly over the wafer surface to form a liquid solvent film;
applying a liquid photoresist to the wafer surface; and
spreading the photoresist over the solvent film while a thickness of at least 100 Angstroms of liquid solvent remains on the entire wafer surface to wet the wafer surface with a mobile layer of fluid solvent such that the photoresist is distributed in a substantially uniform layer over the entire surface of the wafer.

2. A method according to claim 1 including spinning the wafer to spread the liquid solvent thereon and continuing to spin the wafer during discharge of the photoresist.

3. A method according to claim 2 in which the liquid photoresist is applied, while the liquid solvent film has a thickness sufficient to display interference colors under visible light.

4. A method according to claim 2 in which the liquid solvent is applied while the wafer is static and allowed to stand for a first time interval, the wafer is next spun at a first rate of rotation for a second time interval and then spun at a reduced, second rate of rotation for a third time interval, and the liquid photoresist discharge is commenced at the end of the third time interval while the wafer continues to rotate at said second rate of rotation.

5. A method according to claim 4 in which discharge of the liquid photoresist is stopped after a fourth time interval following commencement thereof and the wafer is spun at an increased, third rate of rotation for a fifth time interval.

6. A method according to claim 5 in which the first and second rates of rotation and the second and third time intervals are arranged so that the top surface of the wafer remains entirely wetted by the solvent film during discharge and spreading of the liquid photoresist.

7. A method according to claim 1 in which the solvent and photoresist are miscible.

8. A method according to claim 7 in which the liquid solvent and the liquid photoresist both include EGMEA.

9. A method according to claim 8 in which the liquid solvent further includes HMDS.

10. A method according to claim 1 in which the solvent has a viscosity less than a viscosity of the photoresist.

11. A method according to claim 1 in which the solvent film has a thickness in a range of 1,000 to 5,000 Angstroms when application of the photoresist is commenced.

12. A method for applying photoresist to a top surface of a semiconductor wafer for defining an electronic circuit pattern thereto, the method comprising:
positioning the wafer on a horizontal turntable with the top surface facing toward;
discharging a liquid solvent onto a central area of the top surface;
spinning the wafer to distribute a film of the solvent to a substantially uniform thickness over the entire top surface of the wafer;
discharging a liquid photoresist onto the central area of the top surface of the wafer over the solvent film;
spinning the wafer to distribute the photoresist in a layer over the entire top surface of the wafer; and
controlling the discharge of photoresist so that the top surface of the wafer remains entirely wetted by a mobile fluid layer having a thickness of at least 100 Angstroms of the solvent film during discharge and distribution of the liquid photoresist.

13. A method according to claim 12 in which the wafer has an intermediate electronic circuit pattern formed thereon, the intermediate circuit pattern including at least one of bare silicon surfaces, high density circuit features and undercut circuit features; the solvent having a viscosity less than the viscosity of the liquid photoresist and the solvent film having sufficient fluid thickness to cause the photoresist to fully cover said bare silicon, high density and undercut circuit features.

14. A method according to claim 12 in which the solvent film has a thickness in a range of 500 to 10,000 Angstroms when application of the photoresist is commenced.

15. A method according to claim 12 in which the wafer is spun at a first rate of rotation for a first time interval to distribute the solvent film and then spun at a reduced, second rate of rotation for a second time interval, and the liquid photoresist discharge is commenced at the end of the second time interval while the wafer continues to rotate at said second rate of rotation.

16. A method according to claim 15 in which discharge of the liquid photoresist is stopped after a third time interval following commencement thereof and the wafer is spun at an increased, third rate of rotation for a fourth time interval.

17. A method according to claim 15 in which the first and second rates of rotation and the first and second time intervals are arranged so that the top surface of the wafer remains entirely wetted by the solvent film during discharge and distribution of the liquid photoresist.

18. A method as in claim 1 in which the liquid solvent comprises a glycol ether solvent.

19. A method as in claim 1 in which the liquid solvent comprises a glycol monoethyl ether acetate solvent.

20. A method as in claim 1 in which the liquid solvent comprises an ethylene glycol monoethyl ether acetate solvent.

* * * * *